United States Patent [19]

Zhang et al.

[11] Patent Number: 5,492,613
[45] Date of Patent: Feb. 20, 1996

[54] PROCESS FOR ELECTROLESS PLATING A METAL ON NON-CONDUCTIVE MATERIALS

[76] Inventors: Shaoxian Zhang; Rongsheng Han; Chuanming Zheng, all of c/o NTD Patent Agency, Ltd., 10F, 6 Beisanhuanzhong Road, Dewai, Beijing 100011, China

[21] Appl. No.: 933,861

[22] Filed: Aug. 24, 1992

Related U.S. Application Data

[63] Continuation of Ser. No. 587,167, Sep. 20, 1990, abandoned, which is a continuation of Ser. No. 147,384, Jan. 26, 1988, abandoned.

[30] Foreign Application Priority Data

Jan. 27, 1987 [CN] China ..................... 87100440

[51] Int. Cl.$^6$ .......................... C23C 18/18; C23C 18/31
[52] U.S. Cl. .................... 205/163; 106/1.11; 427/304; 427/305
[58] Field of Search ....................... 205/167, 168, 205/169, 163; 427/304, 305, 306, 98; 106/1.11

[56] References Cited

U.S. PATENT DOCUMENTS

| | | | |
|---|---|---|---|
| 3,874,897 | 4/1975 | Fadgen, Jr. et al. | 204/38.4 |
| 3,930,072 | 12/1975 | Wilks | 427/306 |
| 3,961,109 | 6/1976 | Kremer et al. | 427/304 |
| 4,005,238 | 1/1977 | Gaehde et al. | 428/313 |
| 4,078,096 | 3/1978 | Redmond et al. | 427/98 |
| 4,080,513 | 3/1978 | Cuneo et al. | 174/68.5 |
| 4,082,557 | 4/1978 | Pizzio | 106/1.11 |
| 4,181,750 | 1/1980 | Beckenbaugh et al. | 430/414 |
| 4,192,764 | 3/1980 | Madsen | 430/455 |
| 4,259,376 | 3/1981 | Feldstein | 427/304 |
| 4,511,597 | 4/1985 | Teng et al. | 427/555 |
| 4,650,550 | 3/1987 | Milnes et al. | 204/38.7 |
| 4,663,199 | 5/1987 | Liebler et al. | 427/304 |

OTHER PUBLICATIONS

Arthur Rose et al. The Condensed Chemical Dictionary, seventh edition, Reinhold Book Corp., New York, 1966, p. 503.

F. A. Lowenheim, *Electroplating*, McGraw-Hill Book Co., New York, 1978, pp. 404–408, 416–425.

*Primary Examiner*—John Niebling
*Assistant Examiner*—William T. Leader
*Attorney, Agent, or Firm*—Rines and Rines

[57] ABSTRACT

The present invention discloses a process for electroless plating a metal on the surface of almost all the common nonconductive material substrates by brushing or spraying composite chemical solutions onto said surface. When practicing the present invention, metal can be quickly deposited on the surface and firmly bound with the substrate. In addition, the composite chemical solutions used in the invention can be prepared from raw chemicals which are nontoxic and do not cause environmental pollution. Since the process does not require immersing or dipping, it allows metal to be deposited either on the entire surface or on a portion of a surface of the substrate without any restriction of the dimensions of the substrate. In one embodiment, the substrates may be glass, silicates or ceramics and may be sensitized using a solution which comprises about 25–175 g/l $SnCl_2$, about 35–110 g/l of about 36% HCl, and about 50–100 g/l of about 95% ethanol. The sensitizing solution may also contain an indicator such as thymol blue.

5 Claims, No Drawings

PROCESS FOR ELECTROLESS PLATING A METAL ON NON-CONDUCTIVE MATERIALS

This is a continuation of application Ser. No. 587,167, filed Sep. 20, 1990, and now abandoned, in turn a continuation of application Ser. No. 147,384, filed Jan. 26, 1988 and now abandoned.

BACKGROUND OF THE INVENTION

The present invention relates to a process for electroless plating a metal on non-conductive materials, and more particularly, it relates to a process of depositing a metal layer on surfaces of various non-conductive materials such as plastics, glass, ceramic body, wood, stone, plaster body, cement article and articles made of bamboo etc. by electroless brushing or spraying chemical compositions onto said surface to bring about chemical reactions. This invention also relates to the products obtained by the above said process.

Processes for depositing metals on conductive materials by bath electroplating or by brush electroplating have been widely used for a long time. It is also well-known to deposit a metal on the surfaces of nonconductive material substrates by treating the surface to provide surface conductibility, and then depositing metals on the conductive surface of said non-conductive material by bath electroplating or brush electroplating (U.S. Pat. Nos. 4,481,081 and 4,165,394).

Surfaces of some non-conductive nonmetal materials such as ceramics, plastics etc. are first subjected to etching, then treated with a linking agent capable of providing sites for stannous ion adsorption on said surface by immersion or dipping, primed with aqueous solution containing stannous and copper ions by immersion or dipping, followed by immersion or dipping with a reducing agent capable of reducing the valence state of the copper ions, and finally electrolessly plated to deposit a metal layer on said surface. This process is also well known (U.S. Pat. No. 3,993,848).

However, up to now, all the existing processes for depositing metals on non-conductive material substrates cannot be carried out without a plating bath; that is to say, the substrate to be plated must be immersed or dipped in a pretreatment solution and plating solution. Therefore, the application of said processes is restricted by many factors. First, the dimensions of the substrate to be plated must be within a certain range since it is impossible to provide very large plating baths in practice. Then, the kinds of platable materials are restricted, since a porous material would absorb a large amount of plating solution resulting in greater expenses. Further, such processes are not suitable for plating only a portion of the surface of material.

Through investigation on the matter of electroless plating for years, the present inventor has found that metal can be deposited on the surfaces of various nonconductive material substrates only by brushing or spraying certain composite pretreatment solutions that are a sensitization solution and an activation solution, and a certain composite electroless plating solution, without the necessity of immersing said substrate in a bath solution.

The process according to the present invention does not require the immersing or dipping step existing in prior art processes, and it has the advantages of simplicity in apparatus and flexibility in process, by which a metal can be deposited on the surfaces of various nonconductive materials, either on the entire surfaces or on a portion of a surface, without any restriction of the dimensions and surface state of the substrate to be plated. Using the process of this invention, a metal can be deposited quickly and bound firmly on the surface of the substrate, with low consumption of pretreating and plating solutions. There is no restriction of the temperature at which the process is carried out. Further, no CN group is present in the composite solutions used in the present invention, and all the composite solutions are prepared from substances which are nontoxic and cause no pollution to the environment.

OBJECTS AND SUMMARY OF THE INVENTION

Generally, the present invention provides a process for depositing metals on nonconductive material surfaces.

One object of the present invention is to provide a method for depositing metals on the surface of one type of nonconductor organic material substrate which can withstand acidic corrosion and exhibits surface nonpolarity or weak polarity, by electroless plating with a composite chemical solution, which is characterized in that the process is effected only by brushing or spraying without an immersion bath. The process, in summary, comprises the following steps:

(1) the surface of the substrate to be plated is subjected to the pretreatment including optionally the mechanical grinding, contacting with a chemical agent solution and/or an organic solvent to roughen the surface;

(2) the surface having been toughened in step (1) is treated with a strong acidic solution containing a negative ion surfactant in the amount of 0.0001–0.1 g/l, preferably 0.001–0.1 g/l, and metal ions which are apt to be oxidized by the positive ions of a metal having catalytic activity, but can hardly be oxidized by air, by means of brushing or spraying to sensitize the surface;

(3) the surface having been sensitized in step (2) is treated, by brushing or spraying with a solution containing positive ions of a metal having catalytic activity to activate the surface; sometimes, steps (2) and (3) can be carried out simultaneously;

(4) a solution containing ions of the desired metal to be deposited on the substrate surface is brushed or sprayed on the surface having been activated in the step (3), until a desired thickness of the metal layer is deposited on said surface.

Another object of the present invention is to provide a method for depositing a metal on the surfaces of a second type of nonconductive material substrates which can withstand acidic corrosion and exhibit either a surface polarity or a surface affinity for water. The process procedure of depositing metal on this kind of material is substantially the same as that of depositing metal on the surface of the first type of nonconductive materials having nonpolarity or weak polarity with identical apparatus and tools. The difference between the two is in that different treatment solutions are respectively used. The feature of the latter case is that the composite sensitization solution contains a certain amount of alcohol and indicator which can combine with the ions acting as sensitization agent to form a complex compound, for example, thymol blue or the like.

Still another object of the present invention is to provide a method for depositing metal on the surfaces of a third type of nonconductive material which can withstand strong alkaline corrosion or exhibits alkaline properties. The process procedure, apparatus and tools used for depositing metal on the surfaces of this kind of materials are substantially the same as that of the above two cases, which is characterized in that the composite sensitization solution contains a certain amount of strong alkaline, alcohol and an indicator agent which can combine with the ions acting as sensitization agent to form a complexing compound.

The process of the present invention can be used in a very wide range, by which a metal layer can be deposited on various nonconductive materials only by brushing or spraying different composite chemical agent solutions dependent on the kind of material to be plated.

After depositing a metal layer on the material, the surface of the material becomes conductive, so a further metal layer can be deposited by any conventional brush electroplating or bath electroplating, and, of course, any methods of metal surface treatment can be used for further processing the metal surface formed according to the present invention.

Still another object of the present invention is to provide composite sensitization solutions used in depositing metal on various different materials according to the present invention.

DESCRIPTION OF INVENTION

1. A composite sensitization solution suitable for the above-mentioned first type of materials, including acid-resistant nonconductive material and organic materials having nonpolarity surface or weak polarity surface, is provided. The solution contains a high concentration of metal ions acting as sensitization agent, which metal ions are apt to be oxidized by positive ions of a metal having catalytic activity but can hardly be oxidized by air. Stannous ion is an example of such ions. The concentration of stannous ion is in the range of 50–350 g/l.

A large amount of acid is to be added into this composite sensitization solution and a small amount of indicator may also be added, such as thymol blue.

The characteristic of this solution is that it contains a low concentration of negative ion surfactant. It is better to use a straight chain alkyl-sulfonate, preferably having 8–20 carbon atoms, as surfactant. The concentration of the surfactant should be very low, generally it is in the range of 0.0001 g/–0.1 g/l, and not beyond 1 g/l. The binding strength between the deposited metal layer and the substrate will be lowered if the concentration of the surfactant is too high, while too low a concentration of the surfactant will cause misdeposition and lower the deposition rate during brush plating.

Practice has shown that it is better to prepare beforehand an aqueous solution comprising an alkyl-sulphonate of 0.001–1 g/l and hydrochloric acid of 20–25% by weight to be used as the surfactant component during preparing the composite sensitization solution. This composite sensitization solution may contain a little amount of propanetriol and has the following basic composition:

| | |
|---|---|
| $SnCl_2$ | 50–350 g/l |
| 36% Hydrochloric acid | 50–150 g/l |
| WJ-1 | 10–100 g/l |
| GY | 5–10 drops/l |
| Balance | Water |

In the specification, WJ-1 represents the aqueous solution comprising 0.001–1 wt % alkyl-sulphonate and 20–25 wt % hydrochloric acid; GY represents an aqueous solution comprising propanetriol of 70–80% by weight.

2. A composite sensitization solution suitable for the second type of nonconductive materials which can withstand acidic corrosion and exhibit either a surface polarity or surface affinity for water, contains the same metallic ions as that in the above first solution, only the concentration thereof is a little bit lower. Also, in this solution, the acid content is less than that in the first solution.

The characteristic of this sensitization solution is that it contains a certain amount of alcohol, most commonly ethanol, and an indicator capable of complexing with the ions acting as sensitization agent. Said indicator will change in color during brush plating to indicate the result of the deposition of the catalytic metal, thus making the deposition uniform and perfect. Ethanol is volatile; so the concentration of this solution will increase during the sensitization step.

This composite sensitization solution may also contain propanetriol.

Generally, the materials suitable to be treated with this sensitization solution are easily wetted by water. Therefore, it is unnecessary to add surfactant thereinto. It should be noted that the ethanol content in this solution should be adjusted according to the specific substrate material.

The compositions of this solution are:

| | |
|---|---|
| $SnCl_2$ | 25–175 g/l |
| 36% hydrochloric acid | 35–110 g/l |
| JJ | 50–100 g/l |
| GY | 3–5 drops/l |
| Balance | Water |

In the specification, JJ represents an alcohol solution comprising thymol blue indicator of 0.01–1% by weight and 95% alcohol.

3. A composite sensitization solution suitable for the third type of materials which can withstand strong alkaline corrosion or exhibits alkaline properties, contains the same metallic ions as that in the above first and second solutions. But this solution contains a large amount of strong alkaline in which the metallic ions are completely dissolved.

The characteristic of this solution is that it contains a large amount of tartrate, and its concentration is in the range of 120–270 g/l. A certain amount of alcohol (ethanol being the most commonly used), can be added into this solution; the indicator capable of complexing with the metallic ions acting as sensitization agent can also be added.

The compositions of this solution are:

| | |
|---|---|
| $SnCl_2$ | 50–100 g/l |
| NaOH | 100–150 g/l |
| Sodium-potassium tartrate | 120–170 g/l |
| JJ | 50–100 g/l |
| Balance | Water |

The composite sensitization solutions provided by the present invention are nontoxic and cause no pollution to the environment. The raw chemicals are relatively inexpensive and easily obtainable. The preparation of the solutions is quite simple and easy to handle. Therefore, such solutions can be used extensively under various conditions.

When practicing the process of the present invention, the apparatus is very simple, the process has flexibility and the rate of depositing metal is very quick. A metal can be deposited on almost any common nonconductive material by selecting a proper composite sensitization solution depending on the surface properties of the substrate materials to be plated.

The terminology of "the material can withstand acidic corrosion" (type one, above), refers to a material which basically does not react with acid; and if the surface of this material is treated with acidic solution, there will be no unfavorable effects on the properties and the shape of the material itself. The representative examples of these kinds of nonconductive materials are various plastics, various glass, organic glass, enameled ceramics, granites, silicate stone, bamboo and some kinds of wood, etc.

"The materials having surface nonpolarity or weak polarity" (type one), include almost all kinds of common organic materials. Representative examples of these materials are various resins or plastics such as epoxy resin, phenolplast, polyethylene, polyeulfones, polyvinyl chloride, aminoplastics, some A.B.S. plastics, polytetrafluoroethylene, polyaldehyde, etc.

"The materials exhibiting a surface polarity or a surface affinity for water" (type two, above), refer to the nonconductive materials having microporous surface or being apt to be wetted by water. Examples of this kind of material are plainly sintered ceramics, clay articles, gypsum articles, wood and bamboo, etc., and some kinds of A.B.S. plastics.

"The materials which can withstand alkaline corrosion or exhibit alkaline properties" (type three, above), refer to the nonconductive materials which do not react with alkaline or the materials which cannot be treated with an acidic solution due to its reaction with acid. Examples of this kind of material are carbonate-containing materials such as marble, limestone, cement articles, granite stone, silicate stone, wood fruit, bamboo, rattans.

In the roughening step of the present invention, either mechanical toughening, chemical agent toughening or solvent toughening may be selected based on the specific substrate material to be plated. Of course, all these three toughening methods can be simultaneously, or no roughening step is required for some specific materials. The mechanical roughening may be any mechanical toughening process, such as grinding, sandblasting, abrasion with emery cloth, etc. Roughening solvent should be chosen according to the specific substrate to be plated. For example, for the substrate of organic glass, acetone may be chosen as the toughening solvent, and for polyethylene plastics, cyclohexanone may be chosen, etc. The roughening chemical solution may be a mixture of a strong acid and oxidizing agent or a hydrofluoric acid- containing solution as, for example, an aqueous solution comprising 10–30 g/l $CrO_3$ and 125–150 g/l $H_2SO_4$, an aqueous solution comprising 75–125 g/l $H_2SO_4$, 43–127 g/l HF and 30–65 g/l $CrO_3$.

The composite sensitization solution used in the present invention has been discussed hereinbefore in detail. In the practice of the present invention, the sensitization solution should be chosen according to the specific material substrate to be plated. For example, an alkaline sensitization solution is required for marble and the solution containing a negative ion surfactant is required for nonpolarity plastics. Some substrate materials can be treated with different kinds of composite sensitization solutions. For example, some compact wood can be sensitized with either an acidic sensitization solution or an alkaline solution.

For the substrate materials of high water absorption, a pretreatment should be carried out before the sensitization step in order to block up the water-absorbing holes. A conventional process for filling holes can be applied, such as point coating, plastics spraying, etc.

In some cases, the sensitized surface should be rinsed with deionized water to wash away the surplus sensitizing solution and to promote the absorption of the ions used as activating agent.

The activation treatment is to brush or spray the composite solution containing the ions of a metal having catalytic activity on the sensitized surface, thus making the ions reduce to metal particles by the reducing ions absorbed on the surface during the sensitization step, and the metal particles are firmly absorbed on the surface. The catalytic metal particles absorbed on the surface are the nucleating centers during electroless brush-plating, and therefore, the activation should be carried out uniformly and thoroughly.

In the process of the present invention, the composite activating solution may further contain a negative ion surfactant, propanetriol, ethanol or $NH_4OH$ besides the ions used as the activating agent. The common ions are $Ag^+$ and $Pd^{++}$. For the solution containing $Ag^+$, a certain amount of $NH_4OH$ must be added, and propanetriol, ethanol or a negative ion surfactant may also be added according to the specific condition. The concentration of $Ag^+$ in the solution in general is rather high.

For the $Pd^{++}$-containing solution, a certain amount of hydrochloric acid must be added, and a negative ion surfactant and/or a certain amount of ethanol may also be added according to the specific condition. The concentration of $Pd^{++}$ is in the range of 1–5 g/l.

The composite activating solution containing a negative ion surfactant is suitable for the materials exhibiting surface nonpolarity or weak polarity, particularly for an organic material having a nonpolarity surface. The addition of the surfactant in low concentration can improve the deposition effect significantly. For the substrate materials easily to react with acid, the activating solution containing $Ag^+$ must be used.

In some cases, the activated surface may be washed with water and reduced with a conventional reducing agent before the step of electroless brush-plating.

After the above-mentioned steps, the electroless brush-plating is carried out, i.e., continuously applying the chemical brush-plating solution onto the activated surface by means of brushing or spraying to deposit a metal, preferably copper, on the surface. As the metal ions are converted into metal by the reducing agent in the solution, a layer of the deposited metal is gradually formed and firmly bound on the surface to be plated.

The electroless brush-plating solution is also a composite solution, which may contain a conventional reducing agent, complexing agent and buffer agent besides the ions of the metal to be deposited. The concentration of the composite solution is rather high as compared with that in prior art electroless bath-plating, and in the case of depositing copper, the copper ion concentration is in the range of 10–60 g/l, preferably 12–50 g/l, and more preferably 20–50 g/l. The conventional stabilizing agent capable of decreasing the rate of metal depositing should not exist in the composite solution.

After the step of electroless brush-plating, a layer of metal has deposited on the surface of the substrate, thus making the surface conductive. Therefore, the conductive substrate surface can be treated subsequently with any technique suitable for the conductive materials to achieve the final purpose. The most suitable subsequent treatment is the brush electroplating, which requires no immersing bath and will not be restricted by the geometrial shape and dimensions of the substrate. Of course, some substrates may also subsequently be treated by bath electroplating according to the requirement.

Besides the advantages as set forth, the following benefits are also present in the process of the invention. The composite solutions having been applied onto the substrate surface are continuously stirred by brushing, thus accelerating the diffusion rate of the ion particles in the solution so that all of the chemical reaction rate, the absorption rate and the depositing rate are accelerated. The concentrations of the metal ions in the solutions are rather high so that high absorption rate and depositing rate can be achieved.

This invention will be explained in more detail by the following examples.

EXAMPLE 1

Preparation of the composite sensitization solution suitable for the first type of nonconductive materials capable of withstanding acid corrosion and having weak polarity or nonpolarity surface.

150g $SnCl_2$ was placed into a beaker of 1000 ml, then a concentrated hydrochloric acid of 120 ml and the mixing agent of WJ-1 of 60 ml were slowly added into the same beaker with stirring until the $SnCl_2$ was dissolved thoroughly. Subsequently, five drops of the mixing agent GY were added into the solution. The solution was then slowly diluted to one liter volume with deionized water under stirring and then into a brown glass bottle, ready for use.

EXAMPLE 2

Preparation of the sensitization solution suitable for the type two materials capable of withstanding acid corrosion and having surface polarity or affinity for water.

75 g $SnCl_2$ was placed into a 1000 ml beaker. Concentrated hydrochloric acid of 85 ml was added thereto with stirring until the $SnCl_2$ was completely dissolved. The solution obtained was slowly diluted with deionized water to the volume of 800 ml under stirring. The mixing agent JJ of 50 ml and five drops of the mixing agent GY were then added, stirring, and again diluted with deionized water to one liter volume. The solution was stored in a brown bottle ready for use.

EXAMPLE 3

Preparation of the sensitization solution suitable for the type three materials capable of withstanding strong alkaline corrosion or exhibiting alkaline properties.

A predetermined amount of $SnCl_2$ as in Example 2 was dissolved in water to prepare a solution A. Potassium-sodium tartrate was dissolved in water, and then NaOH was added, stirring until completely dissolved; thus, a solution B was prepared.

The solution A was mixed with the solution B, and then mixing agent JJ was added under stirring, and then diluted to a desired volume.

EXAMPLE 4

The compositions and preparation of the composite activation solutions.

| Activation solution (I) | |
| --- | --- |
| Compositions | |
| $AgNo_3$ | 10–35 g/l |
| CA | 15–80 ml/l |
| WJ-2 | 20–30 ml/l |
| Balance | Water |

Preparation 15 g $AgNO_3$ was placed into a 1000 ml beaker, 500 ml deionized water was added, under stirring, and then 25–40 ml mixing agent CA was added until complete dissolution of the produced precipitate. 10 ml mixing agent WJ-2 was then added thereto. The solution is stirred and diluted into a one liter volume, and kept in a brown bottle.

In the specification, the term "WJ-2" refers to a mixing agent solution comprising 50% by weight ethanol, 0.01–1% by weight alkylsulfonate and water; the term "CA" refers also to a mixing agent solution comprising 50% by weight ethanol, 10–15% by weight $NH_4OH$ and water.

| Activation solution (II) | |
| --- | --- |
| Compositions | |
| $AgNo_3$ | 5–15 g/l |
| CA | 10–90 ml/l |
| GY | 1–3 drops/l |
| Balance | Water |

Preparation 10 g $AgNO_3$ was placed into a 1000 ml beaker, 10–15 ml mixing agent CA was added under stirring until complete dissolution of the produced precipitate. Then three drops of mixing agent GY were added and the solution was diluted with deionized water into one liter, stirred and kept in a brown bottle.

EXAMPLE 5

Electroless plating copper solutions.

| Compositions of Solution (I) | |
| --- | --- |
| $CuSo_4$ | 30–90 g/l |
| Potassium-sodium tartrate | 95–230 g/l |
| NaOH | 40–120 g/l |
| 36% HCHO Aqueous solution | 80–250 g/l |
| TCA agent | 120–180 g/l |
| E.D.T.A. | 8–20 g/l |
| Balance | Water |

Here, the term "TCA agent" refers to the mixing aqueous solution comprising 12–15% by weight, $Na_2CO_3$ 10–20% by weight $(C_2H_5O)_3N$ and deionized water.

| Compositions of Solution (II) | |
| --- | --- |
| $CuSo_4$ | 30–80 g/l |
| $(C_2H_5O)_3N$ | 70–200 g/l |
| $Na_2Co_3$ | 10–60 g/l |
| NaOH | 40–180 g/l |
| 36% HCHO aqueous solution | 80–250 g/l |
| Balance | Water |
| Compositions of Solution (III) | |
| $CuSo_4$ | 30–100 g/l |
| Propanetriol | 40–120 g/l |
| $Na_2CO_3$ | 10–50 g/l |
| 36% HCHO aqueous solution | 100–250 g/l |
| Balance | Water |

EXAMPLE 6

Plating copper on the surface of a polychloroethylene board having a thickness of 3 mm, the steps were as follows.

1. The surface of the board was rubbed crosswise with emery paper to reduce the toughening traces, then rinsing away the rubbing sludges.

2. The rubbed surface of the board was treated with an aqueous solution containing 20 g $CrO_3$/l and 200 g/l $H_2SO_4$ by brushing the solution thereto for 3–5 minutes with a speed of brushing of 1–3 m/min., and then rinsing away the solution on the board with water.

3. Sensitization—the roughened surface was treated with the composite sensitization solution prepared in Example 1 to sensitize the surface by careful brushing, the brushing speed being 1–3 m/min.

4. The sensitized surface was washed with deionized water.

5. Activation—the activation solution (I) prepared in Example 4 was brushed on the sensitized surface with the brushing speed of 1–3 m/min. to activate the surface to be plated.

6. The activated surface was rinsed with an aqueous HCHO solution.

7. Electroless brush-plating: the electroless plating copper solution (I) shown in Example 5 was used. The brush was first dipped in the solution, brushing the solution onto the activated surface continuously; the copper ions in the solution were reduced into metal copper and deposited on the surface, gradually forming a copper layer. During the brushing, the speed of the relative motion of the brush to the substrate surface was 4–8 m/min.

8. Wash the plated copper surface with water.

EXAMPLE 7

Copper was plated on a phenolplast board of 2 mm thickness by treating with the same steps as that of Example 6 with the exception that the composite sensitization solution of Example 2 was used in the sensitization step.

The copper plated polychloroethylene board and phenolplast board were tested as samples. Testing items:

1. Immersing the sample into hot water at 50° C. and 100° C. respectively for half an hour, then taking it out and putting it into cold water at 15° C. at once for sudden cooling.

2. The samples treated in item 1 were bent with a bending radius R of 5 cm.

Testing results:

1. No scaling or peeling of the copper coating from the substrate of the two samples was found after the treating of item 1.

2. No scaling or peeling of the copper coating from the substrate of the two samples was found during bending and after bending.

EXAMPLE 8

Plating copper on the surface of a ceramic body without enamel.

In this example, the operating steps of the sensitization and treatment were the same as that mentioned in Example 7, with the roughening step as described below:

Alumina sands of 60–100 mesh were blasted onto the body surface by air pressure of 2–3 Kg/cm$^2$ to roughen the surface; then the toughened body was immersed in water until it was not absorbing water further, subsequently taking it out of water and drying it in air for 30–120 minutes to remove the water on the surface. Then the sensitization step and the other following steps according to Example 7 were carried out.

EXAMPLE 9

Plating copper on the surface of a red pin wooden block.

In this example, the operating steps were the same as that of Example 7 with the exception that the sensitization solution was prepared in Example 3. Finally, copper was deposited on the block.

EXAMPLE 10

Plating copper on marble surface.

In this example, the operation was the same as that of Example 7 with the exception that the sensitization solution was prepared as in Example 3 and the activation solution (II) was used. Finally, a copper layer was bound on the marble surface.

EXAMPLE 11 (Comparison)

In this example, three samples were produced, and the operation was the same as that of Example 6 with the exception that different sensitization solutions (1), (2) and (3) were prepared according to Example 1, but containing respectively different concentrations of GY mixing agent (concentrations of the sodium alkylsulfonate) of 0.8%, 0.03% and 0.00%, respectively, being used. As a result, the binding strengths between the plated copper layer and the polychloroethylene substrate were different.

| Sample | Concentration of Sodium Alkylsulfonate | Result |
| --- | --- | --- |
| 1 | 0.8% | Poor Binding |
| 2 | 0.03% | Firmly Binding |
| 3 | 0.00% | Apt to miss plating |

After reading the specification, it should be understood that various changes and modifications of the preferred embodiments described herein will be apparent to those skilled in the art. Such changes and modifications can be made without departing from the spirit and scope of the invention and without diminishing its attendant advantage. It is therefore intended that such changes and modifications be covered by the present claims.

What we claim is:

1. A process for electroless plating a non-conductive material surface comprising 1. optionally mechanically or chemically roughening the surface of the non-conductive material-to-be-plated;
   2. sensitizing the said surface by brushing or spraying with a first solution containing metal ions of $Sn^{++}$, oxidizable by positive ions of a later-added metal selected from the group consisting of Ag or Pd and having catalytic activity;
   3. activating the sensitized surface by brushing or spraying with a further solution of such positive ions of a metal having catalytic activity selected from the group consisting of $Ag^+$ and $Pd^{++}$, to reduce such positive ions to metal particles absorbed on the said surface and forming nucleating centers; and
   4. further brushing or spraying an electroless plating solution of ions of the desired metal-to-be-plated over said nucleating centers to deposit a thin layer of firmly adhered metal plating of desired thickness;

and in which the non-conductive surface is selected from the group consisting of glass, silicates and ceramics, and in which the sensitizing first solution contains about 36% HCl acid in an amount of about 35–110 g/l, about 95% ethanol in an amount of about 50–100 g/l, and the $Sn^{++}$ is provided in the form of $SnCl_2$ in an amount of about 25–175 g/l.

2. A process as claimed in claim 1 and in which the further step is performed of electroplating upon the said metal plating.

3. A process as claimed in claim 2 and in which the electroplating is effected by one of brush electroplating and bath electroplating.

4. A process as claimed in claim 1 and in which the further solution of the activating step comprises $Ag^+$ and $NH_4OH$.

5. A process as claimed in claim 1 and in which the sensitizing first solution contains a color indicator of the deposition of the catalytic metal.

* * * * *